Figure 1:
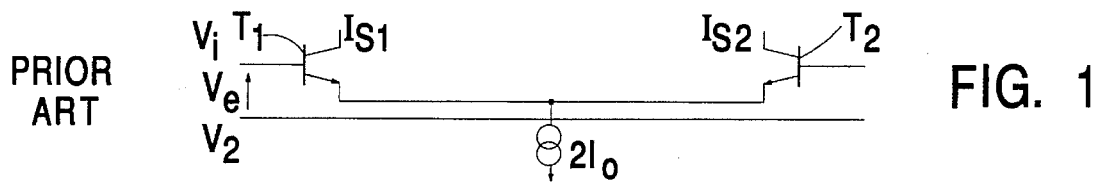

United States Patent [19]
Perrot

[11] Patent Number: 5,512,858
[45] Date of Patent: Apr. 30, 1996

[54] AMPLIFIER STAGE WITH LOW THERMAL DISTORTION

[76] Inventor: Gerard Perrot, 16, rue Boileau, F-92120 Montrouge, France

[21] Appl. No.: 382,045

[22] PCT Filed: Aug. 10, 1993

[86] PCT No.: PCT/FR93/00802

§ 371 Date: Feb. 10, 1995

§ 102(e) Date: Feb. 10, 1995

[87] PCT Pub. No.: WO94/05079

PCT Pub. Date: Mar. 3, 1994

[30] Foreign Application Priority Data

Aug. 11, 1992 [FR] France ................................. 92 09903

[51] Int. Cl.$^6$ ............................................. H03F 3/45
[52] U.S. Cl. ......................... 330/256; 330/258; 330/260
[58] Field of Search ................................. 330/256, 260, 330/258, 289, 293, 295, 310, 311

[56] References Cited

U.S. PATENT DOCUMENTS

| | | | |
|---|---|---|---|
| 3,482,177 | 12/1969 | Sylvan | 330/256 |
| 3,916,333 | 10/1975 | Zuk | 330/260 X |
| 4,528,517 | 7/1985 | Schlotzhauer | 330/256 |
| 4,757,274 | 7/1988 | Bowers . | |

FOREIGN PATENT DOCUMENTS

| | | | |
|---|---|---|---|
| 0156410 | 10/1985 | European Pat. Off. . | |
| 2046357 | 4/1971 | Germany | 330/311 |

OTHER PUBLICATIONS

R. van de Plassche, "A Wideband Monolithic Instrumentation Amplifier", ISSCC Digest of Technical Papers., pp. 194–195, Feb. 1975.

M. Timko et al., "An Improved Monolithic Instrumentation Amplifier", ISSCC Digest of Technical Papers, pp. 196–197, Feb. 1975.

Analog Devices, Data–Acquisition Databook 1984, vol. 1, 5–21, Integrated Circuit Precision Instrumentation Amplifiers.

G. Stocchino, "Low Distortion Amplifier for Instrumentation", Electronic Engineering, May 1983, pp. 35–39.

A. Metz, "Circuit–Design/Process Combo Speeds Horizontal–Amp Slewing", EDN Electrical Design News, Aug. 4, 1983, pp. 173—180.

*Primary Examiner*—James B. Mullins
*Attorney, Agent, or Firm*—Banner & Allegretti, Ltd.

[57] ABSTRACT

The invention relates to an amplifier stage comprising at least one module presenting a first transistor ($T_1$) whose base forms an input terminal and a means to maintain a substantially constant current in the collector-emitter path of the first transistor ($T_1$). Said means is comprised of a first current source ($A_1$) connected to the collector of the transmitter ($T_1$). A feed-back circuit has a direct voltage source ($V_3$) arranged to maintain substantially constant the potential of the collector of the transistor ($T_1$). It presents a path for the main current between a terminal ($S'_1$) of the stage and the emitter of the transistor ($T_1$). The value of said main current is a function of the voltage ($V_3$) and of the potential ($VCT_2$) of the collector of the transistor ($T_1$); this potential remains substantially constant.

13 Claims, 4 Drawing Sheets

AMPLIFIER STAGE WITH LOW THERMAL DISTORTION

The present invention pertains to a type of amplifier stage consisting at least of a first transistor whose base forms an input terminal for an amplified input signal and of a means to maintain an appreciably constant current in the collector-emitter path of the transistor.

Audio circuits make wide use of differential amplifiers, in particular as input stages for amplifier circuits. The most utilized circuit is the two-transistor differential amplifier; however, its linearity, the result of the transfer function of the two transistors, becomes limited as soon as the amplified signals reach a certain amplitude. To correct this problem, numerous circuits have already been proposed to yield more linear differential circuits, more so in the general context than in that of audio signals. This is specifically the case with the circuit of the prior art as mentioned in the above paragraph.

Another problem that affects these circuits, audio circuits in particular, is thermal distortion. The transfer function for these circuits is linked to the characteristics of the transistors utilized. Transistor characteristics are a function of the temperature at the junctions. In fact, these temperatures are a function not only of the ambient temperature conditions, but also of the instantaneous power dissipated in the junctions themselves. This power depends on the amplitude of the signal injected; in the case of audio signals, the amplitude often varies on a scale of approximately ten milliseconds, which is the same order of magnitude as that of the thermal time constant for the transistor junctions.

In the usual networks the circuit transfer functions are hence modulated by the amplitude variations of the signals treated. In the case of audio signals, this problem is quite pernicious, not only because the time constants of these variations have the same order of magnitude as the time constants of the level variations of the signals treated, but also because the ear can detect the variations, which escape standard measures used for signals having stable amplitudes.

The fundamental idea behind the invention is to stabilize the transfer function of an amplifier stage by stabilizing the power dissipated in the transistor(s), which is (are) most critical to the transfer function.

The invention thus pertains to an amplifier stage consisting of at least one module presenting a first transistor, of one semiconductor type, whose base constitutes the input terminal for an input signal to be amplified and of a means to maintain an appreciably constant current in the collector-emitter path of the first transistor (this transistor being utilized either as an emitter follower or as a common-emitter, particularly in a differential amplifier); and comprising a feedback circuit that provides a main current path between a first active terminal of the stage and the emitter of the first transistor; the amplifier stage is characterized in that said means consists of a first current source connected to the collector of the first transistor and in that the feedback circuit is arranged in such a way that the value of said main current is a function of the difference between the voltage of a reference-voltage source and the potential at the collector of the first transistor; the feedback circuit gain (transconductance) is selected such that the potential at the collector of the first transistor is appreciably constant and the voltage of the reference-voltage source is independent of the supply voltage and is selected in order that the first transistor function with an appreciably constant collector-base voltage, preferably a small collector-base voltage, that is, less than 1 volt.

As the current flow in the collector-emitter path of the first transistor is maintained by the current source and as the first transistor's collector potential varies little, since, with respect to the prior art, variations of this potential are reduced by means of the feedback circuit, the transistor operates with an appreciably constant power dissipation and therefore at a temperature relatively equal to the ambient temperature, which accounts for the near-suppression of the effect of modulation on its transfer characteristic by the input signal. In addition, the base-emitter voltage of the first transistor is appreciably constant and does not influence either its gain or its linearity.

In the preferred configuration for the feedback circuit, where the potential at the collector of the first transistor is determined both by the potential of the reference-voltage source and by transistor base-emitter voltages, the path of the feedback circuit's main current includes a second transistor—of a second semiconductor type, opposite that of the first transistor-whose collector is connected to the emitter of the first transistor, whose base is connected to the collector of the first transistor, and whose emitter is connected to the emitter of a third transistor, of the first type, which has its base connected to said reference-voltage source and whose collector constitutes said active terminal of the stage. Thermal distortion in the second and third transistors has little effect on the assembly as shall be indicated hereinbelow.

The first current source may comprise a current control terminal, a first resistor connected between the control terminal and the base of the second transistor.

The first current source may be decoupled by a fourth transistor, of the second semiconductor type, which has its base connected to that of the third transistor, its collector connected to the collector of the first transistor and its emitter connected to said first current source.

In one variant, said terminal of the stage is the supply-voltage terminal for the stage and the amplifier stage is an emitter follower. The circuit may include a control circuit designed to keep the value of the voltage of the reference-voltage source a function of the emitter or base voltage of the first transistor, that is, a function of the output or input voltage of the stage.

In a second variant, the amplifier stage comprises two modules, as defined hereinabove, where the emitter of each module's first transistor is coupled one to the other, preferably by a resistance, in order to form a differential amplifier, in which the active terminals of the two modules serve as outputs for the differential stage.

In the preferred configuration for the differential amplifier stage, variations in the power dissipated in the input transistors of the differential stage, as a function of the possible common-mode signal voltage for the input signals, are eliminated, at least in large part, with the use of a compensation circuit designed to shift the value of the voltage of the reference-voltage source as a function of the common-mode signal voltage of the differential stage. Specifically, the compensation circuit may include a resistance bridge providing a midway point where the voltage is a weighted average, possibly the arithmetic mean of the emitter voltages, of the two modules' first transistors, and it provides a fifth transistor, as emitter follower, as well as a constant voltage generator placed in series between the midway point and the base of a sixth transistor whose emitter supplies said voltage of the reference-voltage source.

Figure 2:
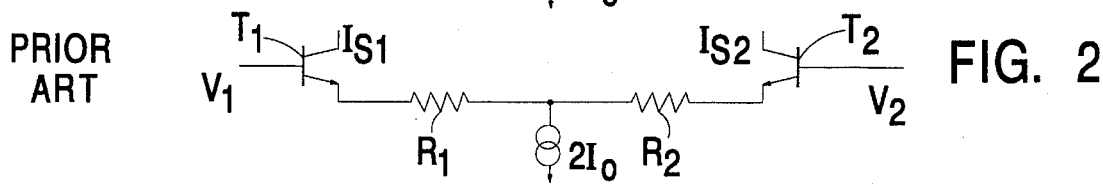
Figure 3:
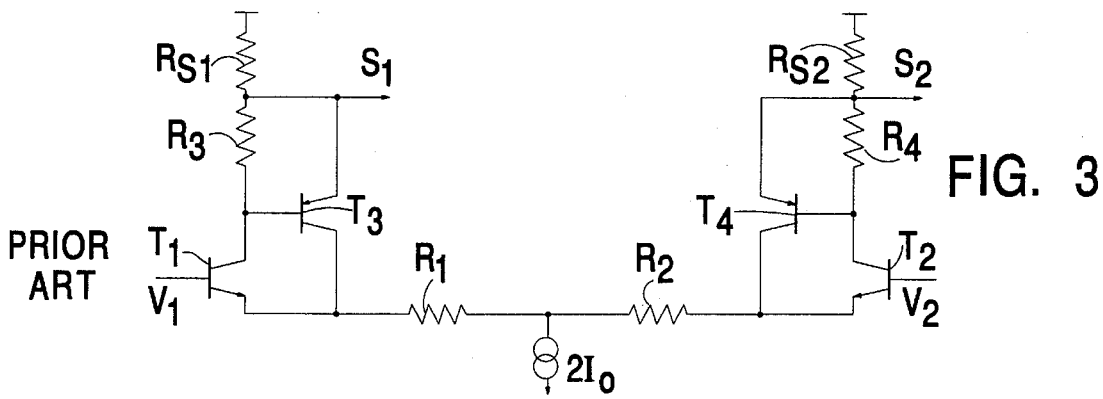
Figure 4:
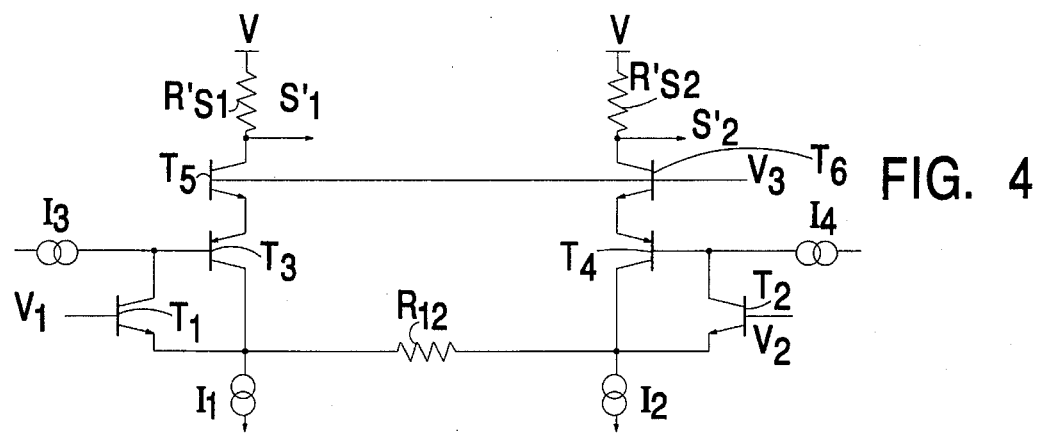
Figure 5:
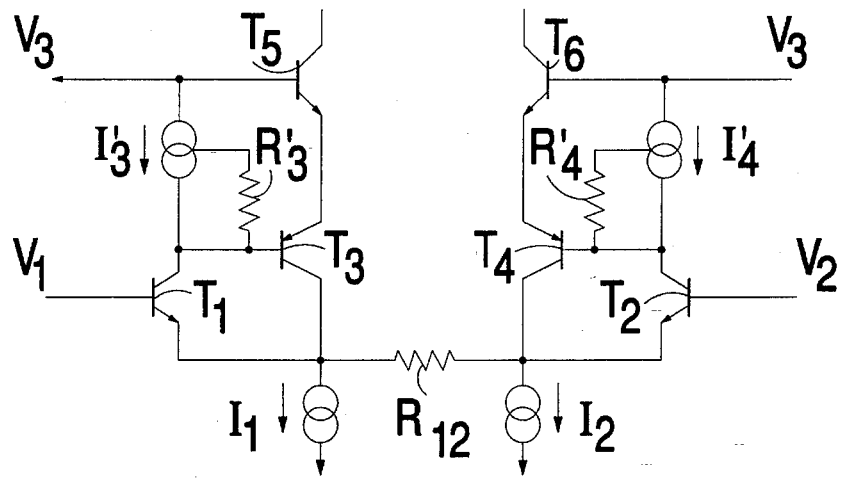
Figure 6:
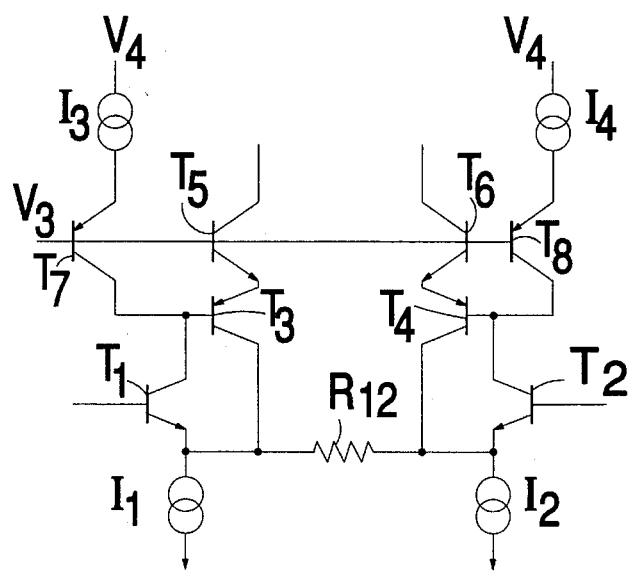
Figure 7:
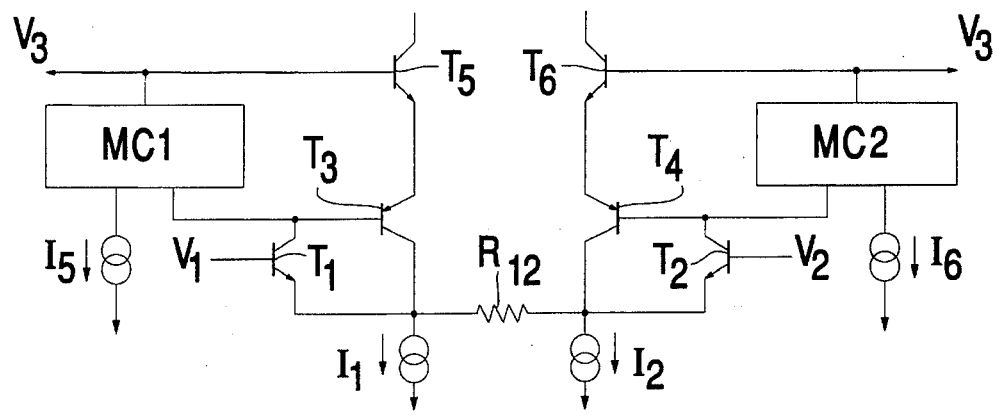
Figure 9:
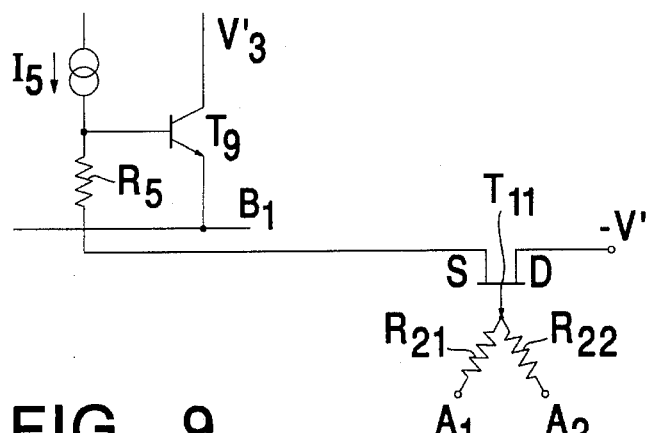
Figure 8:
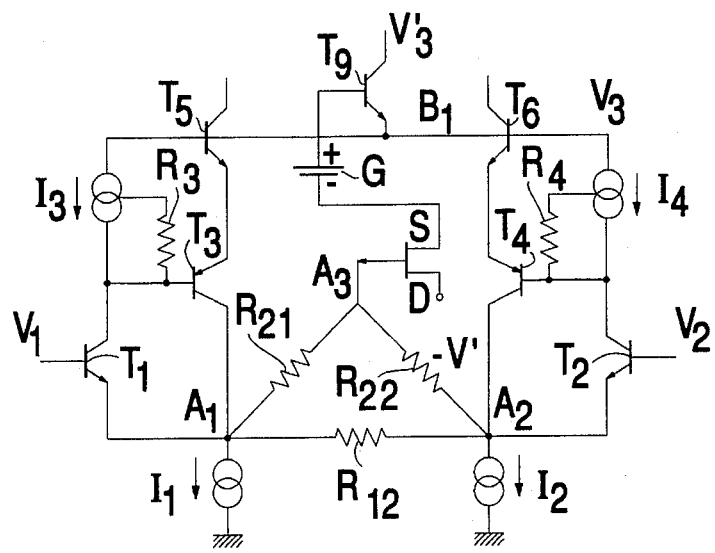
Figure 10B:
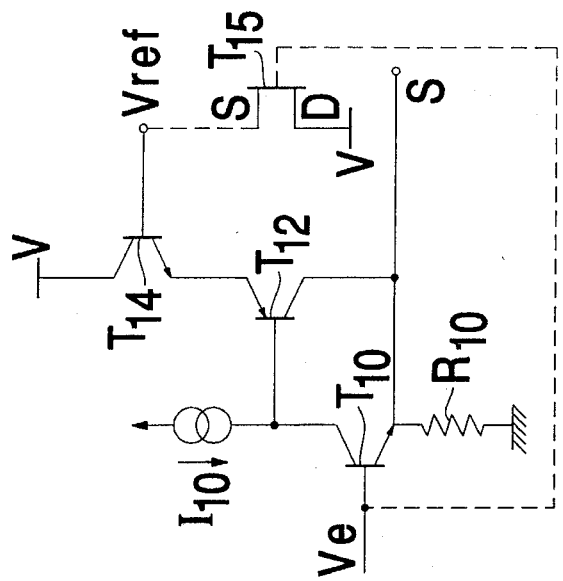
Figure 10A:
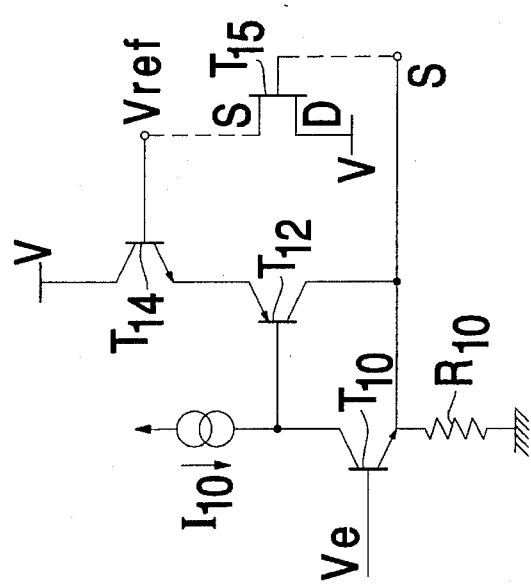

Other features and advantages of the invention shall be better understood upon reading the description that shall follow, given as a non-limiting example, in conjunction with the figures, which represent:

in FIGS. 1 to 3, the differential stages according to the prior art; these are: a simple differential stage, a differential stage with resistor-coupled emitters, and a differential stage with an improved linearity, respectively, in FIG. 4, an initial configuration of the invention, in FIGS. 5, 6 and 7, variants of the first configuration, in FIG. 8, the invention's preferred configuration consisting of a common-mode compensation circuit, of which one particular configuration is shown in FIG. 9, in FIG. 10a and 10b, an amplifier stage that operates, according to the invention, as an emitter follower.

FIG. 1 represents a simple differential stage, in which the emitters of two transistors, $T_1$ and $T_2$, are directly coupled and connected to a current source, $2I_0$. The bases of transistors $T_1$ and $T_2$ see input voltages $V_1$ and $V_2$, respectively, and their collectors yield output currents $I_{S1}$ and $I_{S2}$.

It is standard practice to increase the linearity of this configuration by placing resistors $R_1$ and $R_2$ in series, between the emitters of transistors $T_1$ and $T_2$ and current source $2I_0$. It is also standard practice to add to this type of configuration a cascode, the cascode configuration having the advantage of reducing distortion due to the collector-base capacitances of the first and second transistors, $T_1$ and $T_2$, which form the differential stage (Miller-Effect Compensation).

In FIG. 3 a known configuration is shown that enables the linearity to be improved, by using transistors $T_3$ and $T_4$, of types opposite those of transistors $T_1$ and T2, in a feedback arrangement that keeps the current appreciably constant in the collector-emitter path of transistors $T_1$ and $T_2$. This configuration consists of transistor $T_3$, whose base is connected to the collector of transistor $T_1$, and whose collector is connected to the emitter of transistor $T_1$, resistor $R_3$ being placed between the base and emitter of transistor $T_3$. The emitter of $T_3$ constitutes circuit output $S_1$. Because of output resistor $R_{S1}$, connected to output $S_1$ and to supply-voltage source V, it is possible to obtain an output voltage for the differential stage. Likewise, p-n-p transistor $T_4$, which is of type opposite that of transistor $T_2$ (n-p-n), has its base connected to the collector of transistor $T_2$, and its collector to the emitter of transistor $T_2$, resistor $R_4$ being placed between the base and the emitter of transistor T4 (output S2). The values of resistors $R_3$ and $R_4$ are small (e.g., 700 Ω). Resistor $R_{S2}$ connected between output S2 and supply-voltage source V (a few volts) provides for an output voltage.

As has become apparent to the applicant, this configuration, though it enables the linearity of the differential stage to be increased, in no way leads to a decrease in thermal distortion. In fact, even if the current in the collector-emitter path of transistors $T_1$ and $T_2$ is appreciably stable, the potential at the collector of the transistor varies considerably; in the end, this causes the power dissipated in transistors $T_1$ and $T_2$ to vary as a function of the voltages applied at their base, $V_1$ and $V_2$.

According to the invention, FIG. 4 proposes a configuration that enables the problems of thermal distortion mentioned hereinabove to be eliminated. The load at the collector of transistors $T_1$ and $T_2$ is replaced by current sources I3 and $I_4$, respectively. Two transistors $T_5$ and $T_6$, of same type as transistors $T_1$ and $T_2$, have their base brought up to reference potential $V_3$ and their emitters connected to those of transistors $T_3$ and $T_4$, respectively. The collectors of transistors $T_5$ and $T_6$ now provide outputs $S'_1$ and $S'_2$ of the differential stage (resistors $R'_{S1}$ and $R'_{S2}$). It shall also be observed that, as a variant to this, the emitters of transistors $T_1$ and $T_2$ are shown to be coupled by resistor R12 and each to be connected to a current source, $I_1$ and $I_2$ respectively.

In this configuration, the feedback current is fixed by the difference between the potential at the collector of transistors $T_1$ and $T_2$ and the dc voltage of reference $V_3$. In fact, for transistor pairs $T_3$ and $T_5$ and $T_4$ and $T_6$, the transistors being of opposite type as well as coupled at their emitters, the current in their collector-emitter path is a function of the difference between the voltages applied at their bases. Moreover, the potential at the collector of transistor $T_1$ (or $T_2$) varies little given that it is locked-in at $V_3$—VBE($T_6$)—VBE($T_4$), where VBE is the transistor's base-emitter voltage. The change in voltage at the collectors of $T_1$ and $T_2$ is twice that of the variation of the base-emitter voltages, for transistors $T_3$ and $T_5$ on the one hand and $T_4$ and $T_6$ on the other. In other words, the potential at the collector of transistors $T_1$ and $T_2$ is practically equal to the reference voltage, differing only by a given constant. In addition, since the current in the collector-emitter path of transistors $T_1$ and $T_2$ is fixed by current sources $I_3$ and $I_4$, the power dissipated in transistors $T_1$ and $T_2$, being proportional to the product $V_{CE} \times I_c$, is practically constant ($I_c$ represents the collector current and $V_{CE}$ the collector-emitter voltage of a transistor).

Because the potential at the collector of transistors $T_1$ and $T_2$ varies little, current sources $I_3$ and $I_4$ may be replaced by resistors, preferably with a high resistance value (e.g., 1 MΩ).

Any variation in the input potential of transistor $T_1$ (or $T_2$) tends to modify the transistor's base-emitter voltage, $V_{BE}$. This change in $V_{BE}$ induces a change in the transistor's collector current. A change in current is also found in the base current of transistor $T_3$ (or $T_4$) since the load of transistor $T_1$ (or $T_2$) is a constant current, $I_3$ (or $I_4$). The change in the base current of transistor $T_3$ (or $T_4$) causes a change in its collector current, which, by way of the emitter resistance of transistor $T_1$ (or $T_2$), reproduces the variation in the input potential.

This is how the emitter voltage of transistor $T_1$ (or $T_2$) is slaved to its base voltage, by a first-order constant shift, since $V_{BE}$ conforms to the current imposed by current source $I_3$ (or $I_4$).

Thermal distortion results from short term changes in the junction temperature of the transistors as a function of the signals. In the prior art, the dissipation modulated by the signal amplitudes causes the transistor characteristics to vary-mainly voltage $V_{BE}$ and the current gain. Hence, in the standard differential circuit, thermal variation at the base-emitter voltage, $V_{BE}$, has the same direct effect as a change in the input signal.

In the circuit according to the invention, dissipation in transistor $T_1$ (or $T_2$) is stabilized. It does not lead to any modulation of voltage $V_{BE}$. Transistor $T_3$ (or $T_4$) operates with a weak emitter-collector voltage, $V_{CE}$, while transistor $T_5$ (or $T_6$) sees changes in the emitter-collector current and voltage. The $V_{BE}$ voltages of transistors $T_3$ (or $T_4$) and $T_5$ (or T6), whose current flows in the loop, have little effect on the configuration, because a variation in the emitter-collector voltage of transistor $T_1$ (or $T_2$) accounts for only a weak effect. Changes in the current gain (essentially for transistor $T_5$ (or $T_6$) used as a common base) have little effect on the configuration due to the current feedback loop.

The value of reference voltage $V_3$ is chosen such that collector-base voltage $V_{CB}$ of transistors $T_1$ and $T_2$ is relatively low, that is, less than a few volts, preferably less than 1 volt and typically on the order of 200 to 300 mV.

In FIG. 5, current sources $I_3$ and $I_4$ are replaced by current sources $I'_3$ and $I'_4$, which are located between dc voltage source $V_3$ and the collector of transistors $T_3$ and $T_4$, respectively, and whose current is regulated by a control terminal. Resistors, $R'_3$ and $R'_4$ respectively, are connected between these sources and the base of transistors $T_3$ and $T_4$, respectively.

In FIG. 6, current sources $I_3$ and $I_4$ are coupled to the collector of transistors $T_1$ and $T_2$ via the collector-emitter paths of transistors $T_7$ and $T_8$, respectively, of types opposite those of transistors $T_1$ and $T_2$ and whose base is connected to voltage source $V_3$. The collectors of transistors $T_1$ and $T_7$ are interconnected just as are those of transistors $T_2$ and $T_8$.

In FIG. 7, current sources $I_3$ and $I_4$ are established by means of current mirrors $MC_1$ and $MC_2$, supplied by two current sources $I_5$ and $I_6$ (or by a single current source).

Given that the thermal dissipation in transistors $T_1$ and $T_2$ is linked to the product $V_{CE} \times I_E$, the dissipation may be considered as a constant power, but only for small changes in $V_E$ (up to approximately a hundred millivolts for a differential stage). Because variations in voltage $V_1$ and $V_2$ are reproduced at the emitters of transistors $T_1$ and $T_2$ off by some voltage $V_{BE}$, the appearance of a common-mode component of the input signals has the effect of modifying the power dissipated in transistors $T_1$ and $T_2$. The schematic of FIG. 8 serves to compensate for this deficiency. In so doing, reference voltage $V_3$ is no longer constant, but is controlled by the average of the emitter voltages of transistors $T_1$ and $T_2$. To accomplish this, resistors $R_{21}$ and $R_{22}$, of like value, are connected in series with each other and in parallel with resistor $R_{12}$, and their common node $A_3$ is connected to field-effect transistor $T_9$, whose as a source follower to the base of transistor $T_9$, whose collector is connected to reference-voltage source $V'_3$ and whose emitter is connected (B1) to the base of transistors $T_5$ and $T_6$; a constant voltage generator, G, is situated between transistor and the base of transistor $T_9$. This makes it possible to depart from common-mode, by controlling the voltage at the base of transistors $T_5$ and $T_6$ (reference voltage $V_3$) with some average of the input voltages of $T_1$ and $T_2$ (close by a certain shift in voltage, which is, in practice, on the order of 2 volts). The result is such that the variations in the collector-emitter voltage of transistors $T_1$ and $T_2$ remain negligible.

It shall be noted that resistors $R_{21}$ and $R_{22}$ may be of different value. In general, the base voltage of transistors $T_5$ and $T_6$ is kept at a weighted average of the input voltages of $T_1$ and $T_2$; this makes it possible to take into account any possible peculiarities (such as non-symmetrical signals) when aiming for an optimum, in terms of variation in power dissipated in $T_1$ and $T_2$.

FIG. 9 shows a modification for the figure-8 configuration in which the voltage generator, G, is established by means of current source $I_5$ connected to the base of transistor $T_9$; constant current $I_5$ flows through resistor $R_5$, which is connected to the base of $T_9$ and the source of transistor $T_{11}$.

FIG. 10 depicts an example for the configuration of the invention, where transistor $T_{10}$ is arranged as an emitter follower. A load is connected between the emitter of $T_{10}$ and ground (or a negative or zero potential). The load may be resistor $R_{10}$, for example, or a current source. Current source $I_{10}$ is connected to the collector of transistor $T_{10}$, while transistor $T_{12}$, of type opposite that of transistor $T_{10}$, has its base connected to the collector of $T_{10}$, its collector connected to the-emitter of transistor $T_{10}$ and its emitter connected to the emitter of transistor $T_{14}$, which is of the same type as transistor $T_{10}$ and which has its collector connected to supply-voltage source V and its base connected to reference-voltage source $V_{REF}$. Current source $I_{10}$ determines current flow in the collector-emitter path of transistor $T_{10}$, while the two cascaded base-emitter junctions of transistors $T_{14}$ and $T_{12}$, of opposite types, set the potential at the collector of transistor around $V_{REF} - 2V_{BE}$. In terms of compensation for thermal distortions, the operation is identical to the one described hereinabove. The collector-base voltages, $V_{CB}$, are also of the same order of magnitude as those for transistors $T_1$ and $T_2$.

One variant of FIG. 10, in which transistor $T_{15}$ is used as an example and has its connections indicated by the dashed lines, makes it possible to control reference voltage $V_{REF}$ with respect to output voltage S. Transistor $T_{15}$ (here, an FET) has its drain connected to supply-voltage source V, its gate connected to output S, FIG. 10a (or to the base of $T_{10}$ ($V_e$), FIG. 10b) and its source connected to the base of transistor $T_{14}$. This enables variations in collector-emitter voltage $V_{CE}$ of transistor $T_{10}$ to be kept to minimal levels, even when input potential $V_e$ varies greatly.

The invention is not limited to the configuration specifically described and represented. The invention has been particularly described with bipolar junction transistors. It must be well understood that the invention applies equally as well to the case of field effect transistors. It is therefore necessary to consider that the meaning of the terms "emitter", "base" and "collector" extends to include the terms "source", "gate" and "drain", respectively.

Example: V=15 volts; $V_{REF} = V_3 = 2$ volts $I_1 = I_2 = 5$ mA; $I_3 = I_4 = 2.5$ mA $R'_{s1} = R'_{s2} = 4$ kΩ

$R_{12} = 200$ Ω

I claim:

1. Amplifier stage for audio signals, comprising at least one module presenting a first transistor, of first semiconductor type, the base of which constitutes an input terminal for an input signal and a means to maintain an appreciably constant current in the collector-emitter path of the first transistor, and including a feedback circuit ($T_3$, $T_5$) that provides a main current path between the active terminal ($S'_1$) of the stage and the emitter to the first transistor ($T_1$, $T_{10}$); characterized in that said means consists of a first current source ($I_3$), connected to the collector of the first transistor ($T_1$) and in that the feedback circuit is connected so that the value of said main current is a function of the difference between the voltage ($V_3$) of a reference-voltage source and the potential ($VCT_2$) of the collector of the first transistor ($T_1$); the feedback circuit gain is selected such that the potential at the collector of the first transistor ($T_1$, $T_{10}$) is appreciably constant and the voltage ($V_3$) of the reference-voltage source is independent of the supply voltage and is selected in order that the first transistor ($T_1$) function with an appreciably constant collector-base voltage.

2. Amplifier stage according to patent claim 1, characterized in that said voltage ($V_3$) of the reference-voltage source is selected in order that the first transistor ($T_1$) function with a low collector-base voltage.

3. Amplifier stage according to patent claim 2, characterized in that said low collector-base voltage is approximately 200 mV to 1 V.

4. Amplifier stage according to claim 1 characterized in that the path of the main current of the feedback current includes a second transistor ($T_3$), of second semiconductor type that is opposite that of the first transistor, whose collector is connected to the emitter of the first transistor ($T_1$), whose base is connected to the collector of the transistor ($T_1$), and whose emitter is connected to the emitter of a third transistor ($T_5$), of the first type, the base of which is connected to said reference-voltage source ($V_3$), and the collector of which constitutes said active terminal of the stage ($S'_1$).

5. Amplifier stage according to claim 4, characterized in that the first current source ($I'_3$) includes a current control terminal and in that the first resistor ($R+_3$) is connected between said control terminal of the first current source ($I'_3$) and the base of the second transistor ($T_3$).

6. Amplifier stage according to claim 4, characterized in that the first current source is established from the output branch of a current-mirror ($MC_1$, $MC_2$).

7. Amplifier stage according to claim 4, characterized in that said amplifier stage includes a fourth transistor ($T_7$), of second semiconductor type, whose base is connected to that of the third transistor ($T_5$), whose collector is connected to the collector of the first transistor ($T_1$), and whose emitter is connected to said first current source ($I_3$).

8. Amplifier stage according to ,one of the preceding claims, characterized in that said amplifier stage includes a second current source ($I_1$) that is connected to the emitter of the first transistor ($T_1$).

9. Amplifier stage according to one of the preceding claim 1, characterized in that said active terminal is the supply-voltage terminal (V) for the stage and in that the amplifier stage is an emitter follower.

10. Amplifier stage according to claim 1, characterized in that said amplifier stage includes a control circuit ($T_{15}$) designed to keep the value of the voltage of the reference-voltage source a function of either the emitter voltage or the base voltage of the first transistor ($T_{10}$).

11. Amplifier stage characterized in that said amplifier stage consists of two modules, according to claim 1 where the emitter of the first transistor of each module is coupled to an impedance ($R_{12}$) in order to produce a differential stage ($T_1$, $T_2$), the active terminals of the two modules constituting the outputs of the differential stage ($T_1$, $T_2$).

12. Amplifier stage according to claim 11, characterized in that it includes a compensation circuit ($R_{21}$, $R_{22}$, G) designed to shift the value of the voltage of the reference-voltage source ($V'_3$) as a function of the common-mode voltage of the differential stage ($T_1$, $T_2$).

13. Amplifier stage according to claim 12, characterized in that the compensation circuit includes a resistance bridge ($R_{21}$, $R_{22}$) that provides a midway point (A3) where the voltage is the average of the emitter voltages of the first transistor ($T_1$,$T_2$) of the two modules, and in that it includes a second transistor ($T_{11}$) as an emitter follower, as well as a constant voltage generator (G) placed in series between said midway point (A3) and the base of a third transistor ($T_9$), whose emitter supplies said voltage ($V_3$) of the reference-voltage source.

\* \* \* \* \*